US008207443B2

(12) United States Patent
Borden

(10) Patent No.: US 8,207,443 B2
(45) Date of Patent: Jun. 26, 2012

(54) POINT CONTACTS FOR POLYSILICON EMITTER SOLAR CELL

(75) Inventor: Peter Borden, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 615 days.

(21) Appl. No.: 12/360,804

(22) Filed: Jan. 27, 2009

(65) Prior Publication Data

US 2010/0186807 A1   Jul. 29, 2010

(51) Int. Cl.
  *H01L 31/00* (2006.01)
  *H01L 31/042* (2006.01)
(52) U.S. Cl. .......... 136/256; 136/252; 136/261; 438/83; 438/94; 438/98
(58) Field of Classification Search .................. None
See application file for complete search history.

(56) References Cited

U.S. PATENT DOCUMENTS

| 4,703,553 | A | | 11/1987 | Mardesich | |
|---|---|---|---|---|---|
| 5,011,565 | A | * | 4/1991 | Dube et al. | 438/98 |
| 5,057,439 | A | * | 10/1991 | Swanson et al. | 438/98 |
| 6,403,877 | B2 | * | 6/2002 | Katsu | 136/255 |
| 7,858,430 | B2 | * | 12/2010 | Hilali et al. | 438/72 |
| 2003/0089393 | A1 | | 5/2003 | Fath et al. | |
| 2006/0255340 | A1 | | 11/2006 | Manivannan et al. | |
| 2006/0263642 | A1 | * | 11/2006 | Hieda et al. | 428/826 |

OTHER PUBLICATIONS

A. Metz and R. Hezel, "Record Efficiencies Above 21% for MIS-Contacted Diffused Junction Silicon Solar Cells," 26th PVSC, Sep. 30-Oct. 3, 2007, pp. 283-286.
International Search Report issued Jul. 29, 2009 for International PCT Patent Application No. PCT/US2009/031868.

* cited by examiner

*Primary Examiner* — Jennifer Michener
*Assistant Examiner* — Christopher Danicic
(74) *Attorney, Agent, or Firm* — Mark J. Danielson; Pillsbury Winthrop Shaw Pittman LLP

(57) ABSTRACT

The present invention relates to electrical contacts in a semiconductor device, and more particularly to methods and apparatuses for providing point contacts in a polysilicon emitter or HIT type solar cell. According to certain aspects, the invention uses a dielectric layer interposed between the substrate and a conductive layer to provide a limited area over which junction current can flow. The benefit is that the metal grid conductors do not need to align to the contacts, and can be applied freely without registration. Another benefit of the invention is that it provides increased efficiency for poly emitter and HIT cells through use of point contacts to increase current density. A further benefit is that patterning can be accomplished using low cost methods such as inclusion masking, screen printing or laser ablation. A still further benefit is that final contacts do not need alignment to the point contacts, eliminating registration required for conventional point contact designs.

6 Claims, 5 Drawing Sheets

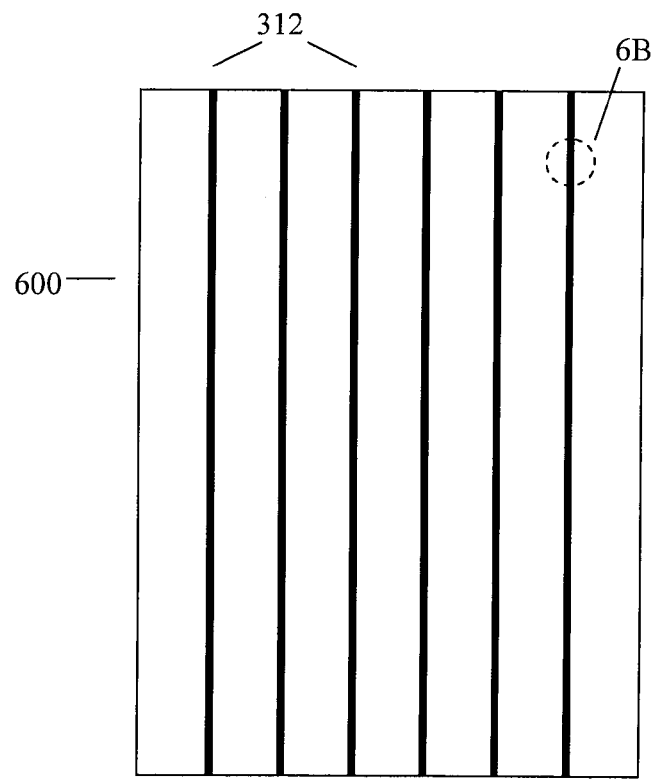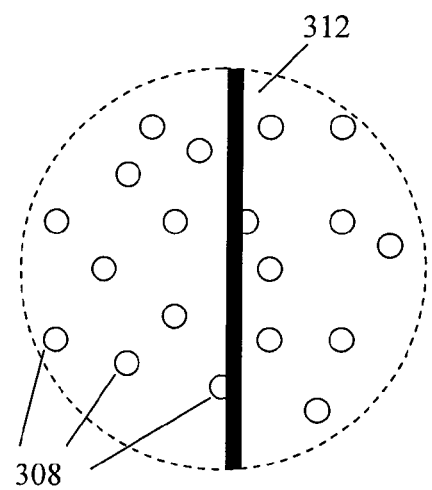
FIG. 6B
FIG. 6A

POINT CONTACTS FOR POLYSILICON EMITTER SOLAR CELL

CROSS-REFERENCE TO RELATED APPLICATIONS

Field of the Invention

The present invention relates to electrical contacts in a semiconductor device, and more particularly to methods and apparatuses for providing point contacts in a polysilicon emitter or HIT type solar cell.

BACKGROUND

It is known that a high efficiency solar cell can benefit from point contacts, as this increases the current density in the junctions. Examples include the PERL cell from the University of New South Wales, which achieved 24.7% efficiency, and the back contact cell made by SunPower Corporation of San Jose, Calif. However, such structures are difficult to fabricate at low cost as they require several lithographic steps that are registered to one another.

FIG. 1 shows one conventional junction contact structure. As shown in FIG. 1, a passivating oxide layer 104 is formed on a bulk material 100 to minimize recombination on the surface. Holes are cut in the oxide using photolithography and wet etching, and n(p)-type regions 102 are diffused into the p(n)-type substrate 100. A second registered lithography is then performed to define contacts 106 over the contact holes. Therefore, at least two patterning steps are required, with the second registered to the first. Such patterning is difficult to perform at the high throughput required for a solar cell line (on the order of 3000 wafers per hour for 100 megawatts).

Accordingly, there remains a need in the art for a less complex structure and technique for forming point contacts in a solar cell.

SUMMARY

The present invention relates to electrical contacts in a semiconductor device, and more particularly to methods and apparatuses for providing point contacts in a polysilicon emitter or HIT type solar cell. According to certain aspects, the invention uses a dielectric layer interposed between the substrate and a conductive layer to provide a limited area over which junction current can flow. The benefit is that the metal grid conductors do not need to align to the contacts, and can be applied freely without registration. Another benefit of the invention is that it provides increased efficiency for poly emitter and HIT cells through use of point contacts to increase current density. A further benefit is that patterning can be accomplished using low cost methods such as inclusion masking, screen printing or laser ablation. A still further benefit is that final contacts do not need alignment to the point contacts, eliminating registration required for conventional point contact designs.

In furtherance of these and other aspects, a solar cell according to embodiments of the invention includes a conductive layer formed over a substrate, the conductive layer providing for junction current flow between the underlying substrate and overlying conductors; a dielectric layer between the conductive layer and the substrate that restricts the junction current flow; and a plurality of point contacts formed in the dielectric layer that enables the junction current flow through the dielectric layer.

In additional furtherance of these and other aspects, a method of fabricating solar cell according to embodiments of the invention includes forming a conductive layer over a substrate, the conductive layer providing for junction current flow between the underlying substrate and overlying conductors; forming a dielectric layer between the conductive layer and the substrate that restricts the junction current flow; and forming a plurality of point contacts in the dielectric layer that enables the junction current flow through the dielectric layer.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 6A and 6B illustrate an example solar cell having point contacts in accordance with aspects of the invention.

DETAILED DESCRIPTION

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
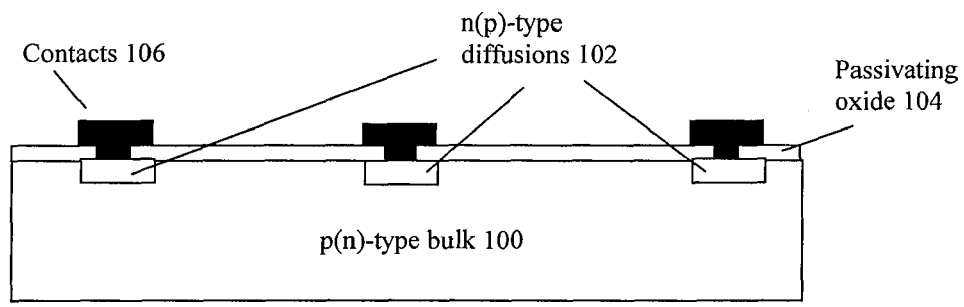
FIG. 1 shows a point contact emitter structure commonly used in conventional high efficiency solar cells.
Figure 2:
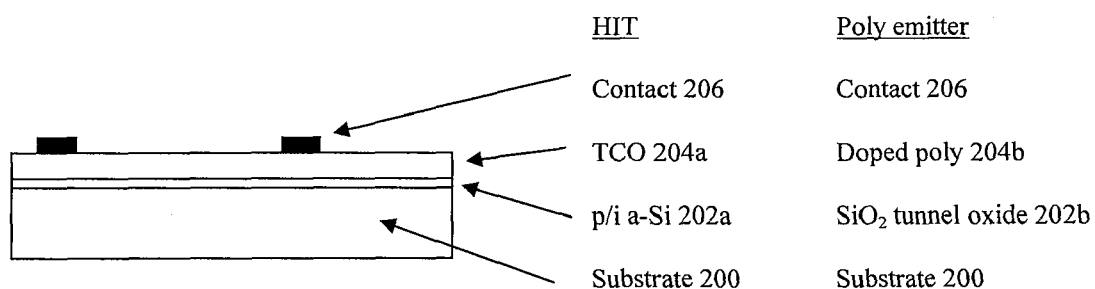
FIG. 2 shows a solar cell structure for conventional HIT and poly emitter type solar cells.

The present inventors recognize that there exist certain cell structures that incorporate a conducting layer over the entire cell surface. These include the HIT cell (Sanyo Corporation) and the polysilicon emitter (PE) cell (See Green, Silicon Solar Cells, chapter 9). FIG. 2 shows how the top structure of such cells are substantially similar. A thin passivation layer such as amorphous silicon 202a (HIT) or a tunneling oxide 202b (PE) is applied directly to the silicon 200 surface. A conductor such as a transparent conductive oxide 204*a* (TCO), as in the case of the HIT cell, or doped polysilicon 204*b*, as in the case of the PE cell, is applied over the passivation layer 202*a*/202*b*. Although these cells benefit from improved contact passivation, they do not show additional gains from higher current density that are possible with point contacts.

According to certain aspects, the present invention therefore uses a dielectric layer interposed between the substrate and a conductive layer to provide a limited area over which junction current can flow, which improves current density. Further contrary to the prior art point structures and techniques, the metal grid conductors do not need to align to the contacts of the present invention, and can be applied freely without registration.

Figure 3:
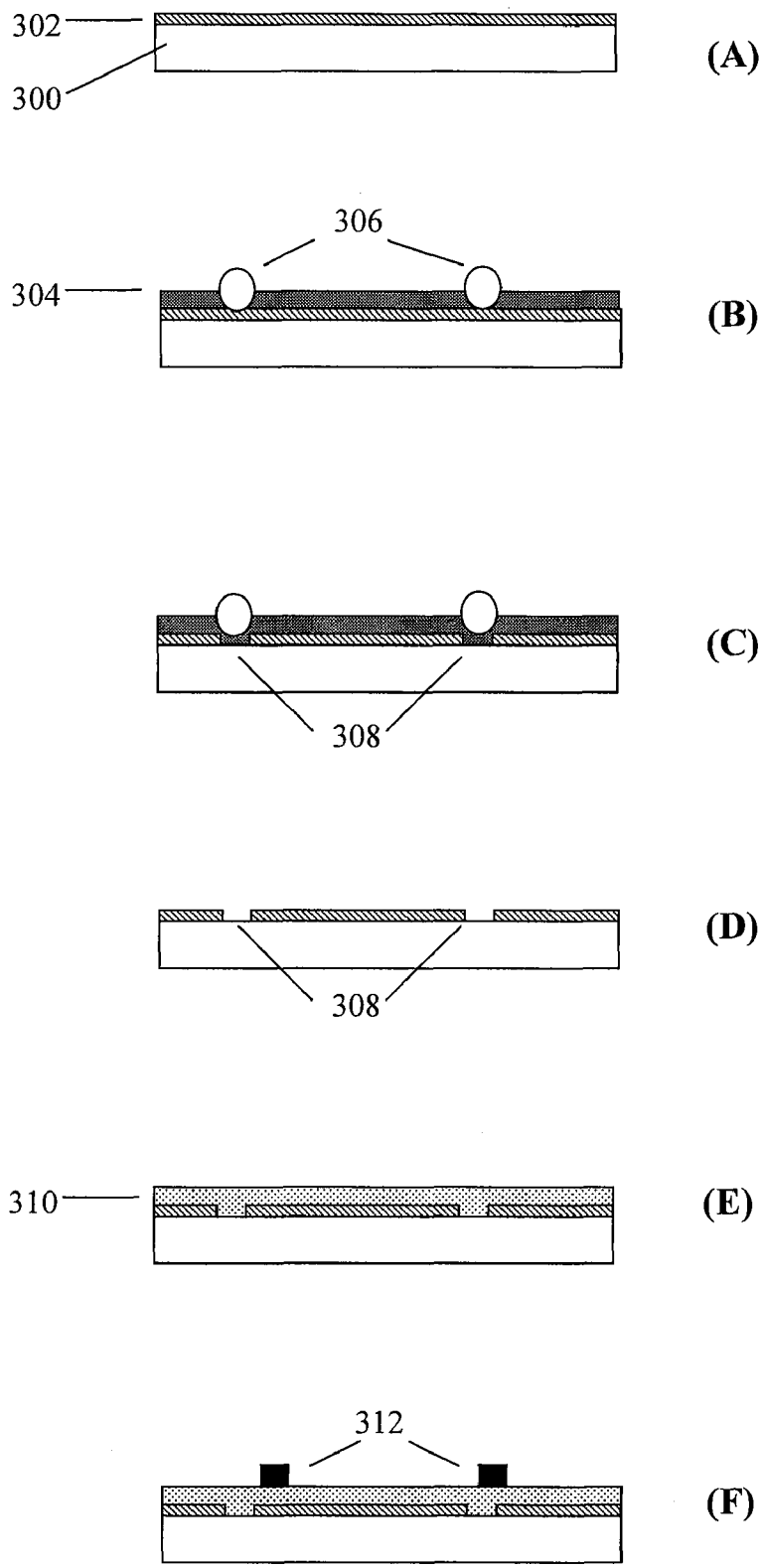
FIGS. 3A to 3F illustrate an example process flow incorporating inclusion masking according to embodiments of the invention.
Figure 4:
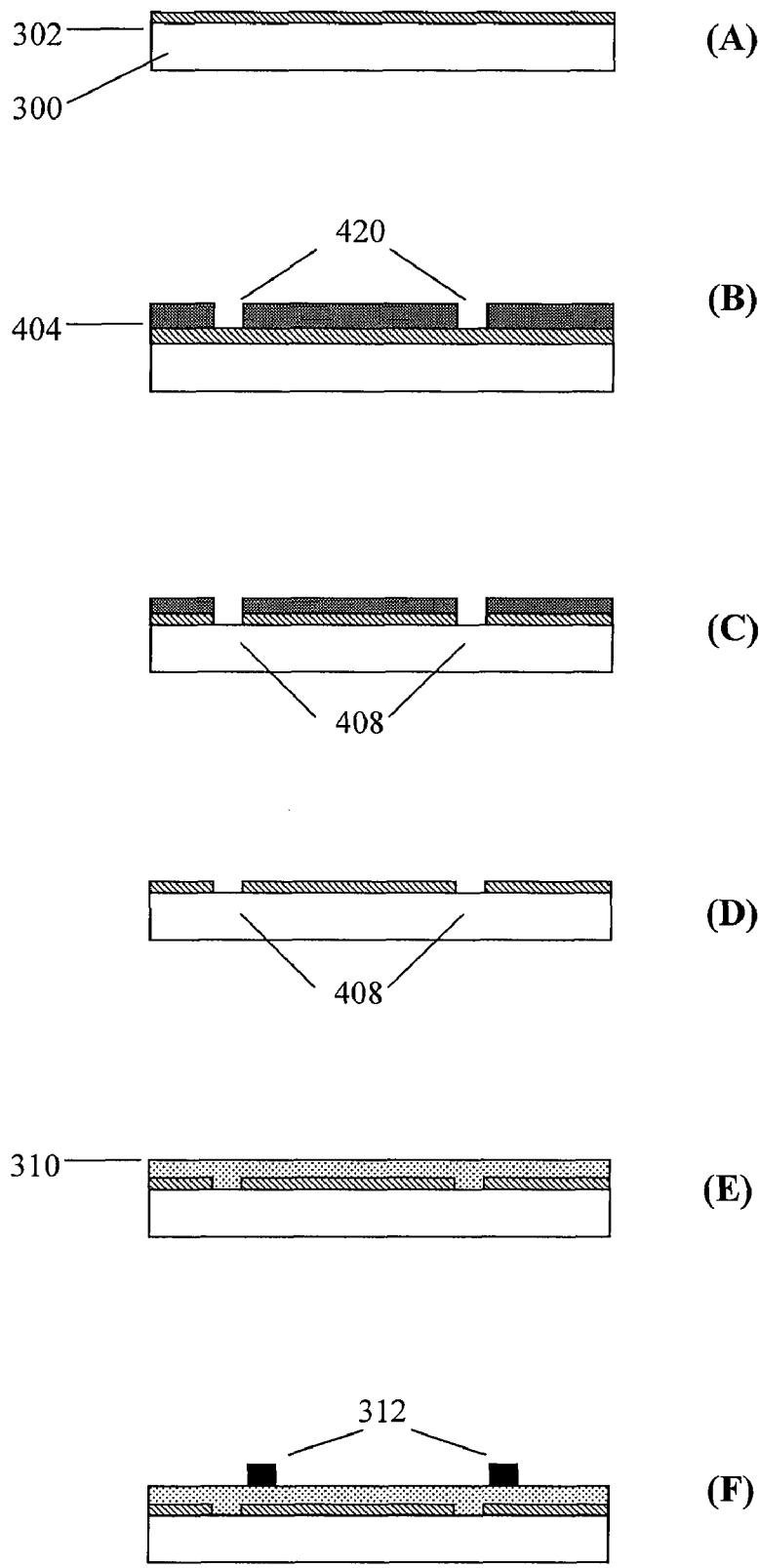
FIGS. 4A to 4F illustrate an example process flow incorporating screen printing according to embodiments of the invention.
Figure 5:
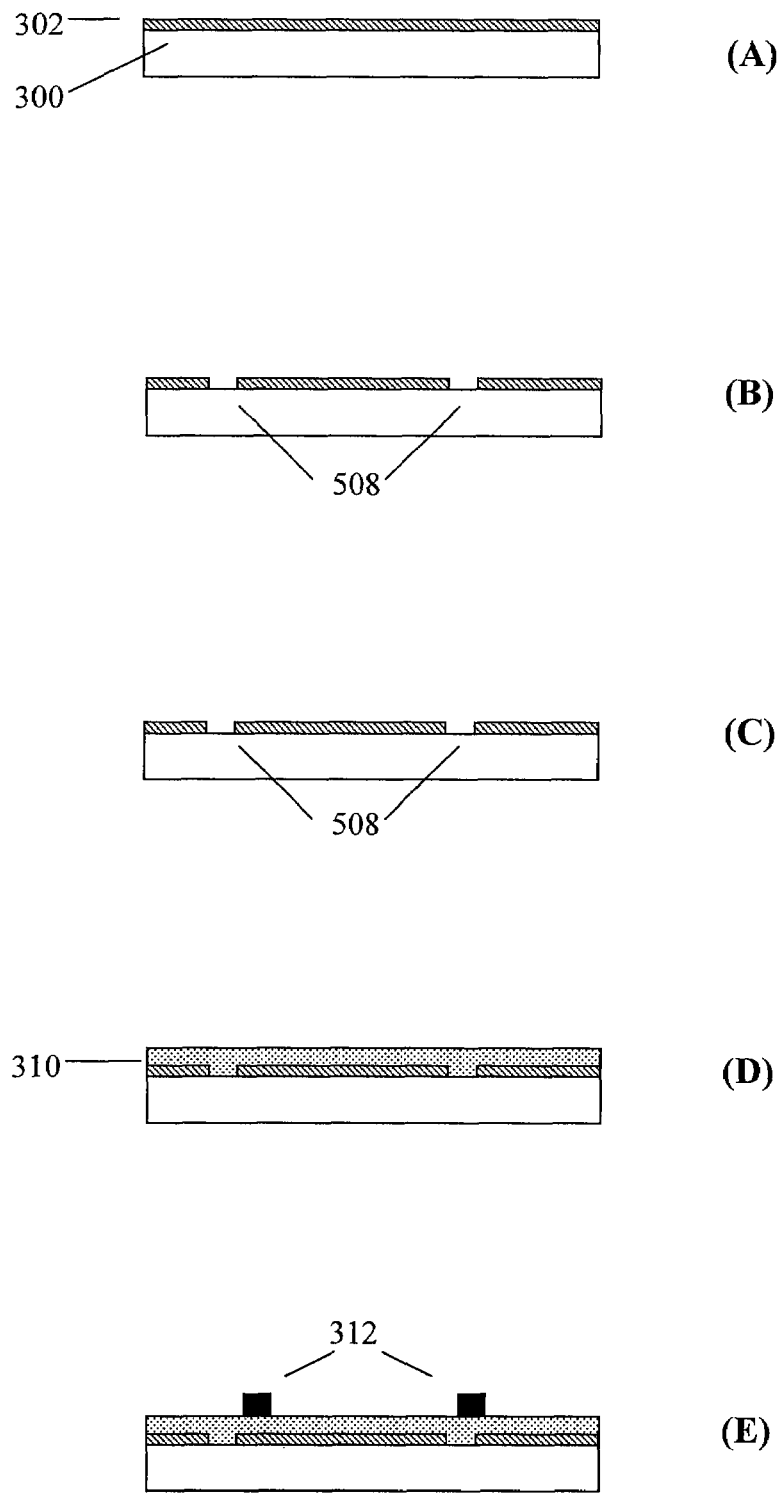
FIGS. 5A to 5E illustrate an example process flow incorporating laser ablation according to embodiments of the invention.

FIGS. 3 to 5 show various ways in which a solar cell having point contacts can be made according to aspects of the invention. It should be noted that the principles of the invention can be applied to both HIT and poly emitter solar cell structures. Accordingly, those skilled in the art will appreciate that the contact passivating layer described below can comprise amorphous silicon for the HIT cell and either a tunnel oxide or direct contact for the PE cell, and the conductor layer can comprise a TCO for the HIT cell or doped polysilicon for the PE cell.

In any of the cell designs shown in FIGS. 3 to 5, a dielectric layer 302 is first formed on the surface of the substrate (FIGS. 3A, 4A and 5A). This is preferably a thermal silicon dioxide, formed as either a rapid thermal oxide or as a conventional grown layer. This layer may be relatively thin, on the order of 50 to 150 Å thick, so that it does not influence the optical properties of the front surface. It should be noted that dielectric layer 302 preferably provides similar aspects of a passivating layer, such as the further purpose of reducing recombination of carriers at the surface.

It is then necessary to form contact holes in the dielectric layer 302 before completing the structure. Several different approaches are shown in FIGS. 3 to 5.

FIG. 3 shows a first embodiment of the invention, referred to herein as inclusion patterning. As shown in FIG. 3B, inclusions 306 are mixed into a masking resist layer 304, which may be any material that resists the subsequent etching of the dielectric layer. Such materials include lacquer films, photoresists, and chemical resins. Inclusions 306 may be particles such as aluminum or calcium chloride. Particles that contaminate silicon or interface layers, such as sodium salts, are less desirable. The inclusions should be of a size on the order of the contact holes, and much larger than the thickness of the resist, e.g., 10 μm inclusions for a 1 μm film. The inclusions 306 have the property that they dissolve or otherwise disrupt the masking action of the resist, allowing etching in their vicinity. Accordingly, as shown in FIG. 3C, when etching of the dielectric layer 302 is performed, holes 308 are etched into the layer 302 in the vicinity of the inclusions 308.

While the inclusions are randomly dispersed in the resist material 304, they have a similar effect to a regular pattern when averaged over the cell area. Typical dimensions might be 10 μm openings on 50 μm spacings, for a 4% contact opening ratio, although other dimensions are acceptable. In general, the opening fraction of the surface area should not exceed about 1%, or current crowding at the contacts will cause series resistance losses.

In another embodiment of the invention shown in FIG. 4, a resist layer 404 is screen printed on the surface and the resist is patterned using conventional photolithography techniques to form pre-defined openings 420, as shown in FIG. 4B. In the embodiments with a resist layer 420, the resist is removed after patterning using a solvent or resist strip solution. Then, as shown in FIG. 4C, the dielectric layer is etched through the patterned resist layer 404 to define contact holes 408.

In a third embodiment of the invention shown in FIG. 5, a laser is used to cut holes directly in the dielectric layer 302. Accordingly, as shown in FIG. 5B, contact holes 508 are formed directly. In typical embodiments, the laser damage must be etched away in an additional process step as shown in FIG. 5C. In embodiments, a picosecond laser is preferably used to perform the laser ablation as it tends to cause the least laser damage.

Following any of the above processing shown in FIGS. 3 to 5, the contact holes 308/408/508 are then cleaned and the contact passivation layer and conductive layer 310 is deposited as shown in FIGS. 3E/4E/5D. It is further preferable to conduct a passivation anneal in forming gas after depositing the passivation layer and conductive layer 310.

Contacts 312 are then applied as shown in FIGS. 3F/4F/5E. In the case of the PE cell, an anti-reflection coating is typically needed as well. This is most simply applied as a deposition following the formation of the contacts.

Although FIGS. 3 to 5 show the contact holes 308 aligned with the grid contacts 312, this is not necessary. In fact, one benefit of the method of forming point contacts according to any embodiment of the invention is that the metal grid conductors do not need to align to the contacts, and can be applied freely without registration. This aspect is illustrated in more detail in FIGS. 6A and 6B.

For example, FIG. 6A is a top view of an example solar cell 600 having metal conducting grid lines 312. It should be noted that the drawings are intended to illustrate aspects of the invention, and are not necessarily to scale. That said, an example solar cell may have grid lines about 80 μm wide and spaced about 2.5 mm apart. FIG. 6B provides a magnified view of a portion of solar cell 600. As shown in FIG. 6B, point contacts 308 formed according to embodiments of the invention can be randomly dispersed with respect to grid lines 312. It should be noted, however, that contacts can also be regularly dispersed in other embodiments. In any event, the grid lines need not be registered to the contacts.

As mentioned above, typical dimensions of contacts 308/408/508 might be about 10 μm wide openings with 50 μm spacings, for a 4% contact opening ratio, although other dimensions are acceptable as will be appreciated by those skilled in the art. In general, the opening fraction of the surface area should not exceed about 1%, or current crowding at the contacts will cause series resistance losses. Nevertheless, an aspect of the invention is that they provide a limited area over which junction current can flow, which improves current density.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A method of fabricating a solar cell comprising:
   forming a conductive layer over a substrate, the conductive layer providing for junction current flow between the underlying substrate and overlying conductors;
   forming a dielectric layer between the conductive layer and the substrate that restricts the junction current flow; and
   forming a plurality of point contacts in the dielectric layer that enables the junction current flow through the dielectric layer,
   wherein the step of forming the point contacts includes:

applying a resist layer that incorporates inclusions over the substrate; and etching the dielectric layer, wherein the dielectric layer is etched predominately at the sites of the inclusions, wherein the inclusions comprise aluminum particles.

2. A method according to claim 1 in which the inclusions dissociate in an etch bath.

3. A method according to claim 1 wherein the step of forming the point contacts includes patterning the point contacts using a laser.

4. A method according to claim 1 wherein the step of forming the point contacts is performed such that the dielectric layer with the point contacts formed therein covers more than 50% of the area between the substrate and the conducting layer.

5. A method according to claim 1 wherein the conductive layer comprises a transparent conductor.

6. A method according to claim 1 wherein the conductive layer comprises doped polysilicon.

* * * * *